(12) United States Patent
Kang

(10) Patent No.: US 11,156,323 B2
(45) Date of Patent: *Oct. 26, 2021

(54) CEILING-TYPE DISPLAY POSITION ADJUSTING DEVICE EMPLOYING LINK STRUCTURE

(71) Applicants: TOP SYSTEM CO., LTD., Siheung-si (KR); Tae Wook Kang, Yongin-si (KR)

(72) Inventor: Tae Wook Kang, Yongin-si (KR)

(73) Assignees: TOP SYSTEM CO., LTD., Siheung-si (KR); Tae Wook KANG, Yongin-si (KR)

( * ) Notice: Subject to any disclaimer, the term of this patent is extended or adjusted under 35 U.S.C. 154(b) by 132 days.

This patent is subject to a terminal disclaimer.

(21) Appl. No.: 16/480,388

(22) PCT Filed: Jul. 5, 2017

(86) PCT No.: PCT/KR2017/007158
§ 371 (c)(1),
(2) Date: Jul. 24, 2019

(87) PCT Pub. No.: WO2018/139718
PCT Pub. Date: Aug. 2, 2018

(65) Prior Publication Data
US 2019/0383437 A1 Dec. 19, 2019

(30) Foreign Application Priority Data

Jan. 24, 2017 (KR) .................. 10-2017-0011035

(51) Int. Cl.
*F16M 11/04* (2006.01)
*F16M 11/10* (2006.01)
(Continued)

(52) U.S. Cl.
CPC ........... *F16M 11/046* (2013.01); *F16M 11/10* (2013.01); *F16M 11/18* (2013.01);
(Continued)

(58) Field of Classification Search
CPC ...... F16M 11/046; F16M 11/10; F16M 11/18; F16M 13/027; F16M 2200/065;
(Continued)

(56) References Cited

U.S. PATENT DOCUMENTS 6,378,353 B1 * 4/2002 Wunderlich .............. B21F 1/00
72/389.4
6,484,993 B2 * 11/2002 Huffman .............. F16M 11/046
248/323

(Continued)

FOREIGN PATENT DOCUMENTS

KR 20-0241392 Y1 10/2001
KR 20-0241393 Y1 10/2001
(Continued)

*Primary Examiner* — Kimberly T Wood
(74) *Attorney, Agent, or Firm* — Novick, Kim & Lee, PLLC; Sang Ho Lee; Hyun Woo Shin

(57) ABSTRACT

Provided is a ceiling-type display position adjusting device employing a link structure, and more particularly, to a ceiling-type display position adjusting device which enables a display that is positioned above the ceiling when the display is not watched to descend from the ceiling when the display is watched, and automatically adjusts a watching angle. The ceiling-type display position adjusting device includes: a body having a hollow shape having an opened lower portion and arranged above a ceiling; a retaining bracket retaining the body; a sliding member that is mounted inside the body and slidable downward below the ceiling; an elevating member sliding the sliding member downward below the body; supports coupled under the sliding member on both, left and right sides; a main link having a rear portion rotatably coupled between the supports via a hinge shaft and (Continued)

a front portion at which a display is mounted; and an angle adjusting unit rotating the main link about the hinge shaft to adjust an angle of the display, wherein the elevating member slides the sliding member in the body in a vertical direction to locate the display above or below the ceiling, and the angle adjusting unit rotates the main link that moved below the ceiling via the elevating member to adjust a watching angle of the display.

4 Claims, 11 Drawing Sheets

(51) Int. Cl.
*F16M 11/18* (2006.01)
*H04N 5/655* (2006.01)
*H05K 5/00* (2006.01)
*H05K 5/02* (2006.01)
*F16M 13/02* (2006.01)

(52) U.S. Cl.
CPC ........... *H04N 5/655* (2013.01); *H05K 5/0017* (2013.01); *H05K 5/0226* (2013.01); *F16M 13/027* (2013.01)

(58) Field of Classification Search
CPC .. F16M 2200/063; F16M 11/24; F16M 13/02; H04N 5/655; H05K 5/0017; H05K 5/0226

See application file for complete search history.

(56) References Cited

U.S. PATENT DOCUMENTS

| | | | |
|---|---|---|---|
| 6,695,289 B1* | 2/2004 | Mickael | B66F 3/12 187/211 |
| 6,708,940 B2* | 3/2004 | Ligertwood | F16M 11/10 248/324 |
| 7,988,131 B1* | 8/2011 | Carder | B66F 3/44 254/122 |
| 9,490,384 B1* | 11/2016 | Strahm | H01L 31/054 |
| 10,148,219 B2* | 12/2018 | Sun | H02S 20/30 |
| 2007/0252919 A1* | 11/2007 | McGreevy | F16M 11/10 348/825 |
| 2011/0121151 A1* | 5/2011 | Stifal | G06F 1/1601 248/284.1 |

FOREIGN PATENT DOCUMENTS

| | | |
|---|---|---|
| KR | 20-0241394 Y1 | 10/2001 |
| KR | 10-2007-0101955 A | 10/2007 |
| KR | 10-1607917 B1 | 3/2016 |
| KR | 10-1613920 B1 | 4/2016 |

\* cited by examiner (a)

(b)

(a)

(b)

CEILING-TYPE DISPLAY POSITION ADJUSTING DEVICE EMPLOYING LINK STRUCTURE

TECHNICAL FIELD

The present disclosure relates to a ceiling-type display position adjusting device employing a link structure, and more particularly, to a ceiling-type display position adjusting device which employs a link structure and enables a display that is positioned above the ceiling when the display is not watched to descend from the ceiling when the display is watched, and automatically adjusts a watching angle.

BACKGROUND ART

In general, a display, that is, a TV, is placed indoors at a position and watched.

Such display occupies one part of a space regardless of whether it is watched or not.

Recently, a display has been installed and used on a wall or a ceiling to be able to increase and actually increase the space use rate.

In particular, a display fixing device for hanging a display on a ceiling, which can be installed on the ceiling, has been developed.

FIG. 1 is a structural diagram of a ceiling-hanging type display fixing device according to the related art.

As illustrated in FIG. 1, the ceiling-hanging type display fixing device according to the related art includes a ceiling-attaching bracket 12; support rods 16 and 18 installed under the ceiling-attaching bracket and having variable lengths; an adjustment bracket 22 connected to the support rods and adjusted in left and right angles; a device-attaching bracket 24 coupled to the adjustment bracket; a pair of bracket connection plates 26 attached at a certain position of the attaching bracket; a bracket 32 for an angle adjustment screw, the bracket being coupled to the bracket connection plates; an angle adjustment plate 30 formed on the bracket connection plates and installed to abut on an outer circumference of the bracket for an angle adjustment screw; and an angle adjustment screw 34 pressurizing the angle adjustment plate against the angle adjustment screw bracket by closely adhering the angle adjustment plate.

However, in the ceiling-hanging type display fixing device according to the related art, a position of a display has to be adjusted or a watching angle is to be adjusted manually, and also, the display is always exposed indoors.

DESCRIPTION OF EMBODIMENTS

Technical Problem

Provided is a ceiling-type display position adjusting device which employs a link structure and enables a display that is positioned above the ceiling when the display is not watched to automatically descend from the ceiling when the display is watched, and automatically adjusts a watching angle of the display.

Solution to Problem

According to an aspect of the present disclosure, a ceiling-type display position adjusting device employing a link structure includes: a body having a hollow shape having an opened lower portion and arranged above a ceiling; a retaining bracket retaining the body; a sliding member that is mounted inside the body and slidable downward below the ceiling; an elevating member sliding the sliding member downward below the body; supports coupled under the sliding member on left and right sides; a main link having a rear portion rotatably coupled between the supports via a hinge shaft and a front portion at which a display is mounted; and an angle adjusting unit rotating the main link about the hinge shaft to adjust an angle of the display, wherein the elevating member slides the sliding member in the body in a vertical direction to move the display above or below the ceiling, and the angle adjusting unit rotates the main link that is moved below the ceiling via the elevating member to adjust a watching angle of the display.

Also, a coupling protrusion that is hinge-coupled to the angle adjusting unit may protrude from the rear portion of the main link to rotate the main link about the hinge shaft, and the angle adjusting unit may include a first coupling member hinge-coupled to the coupling protrusion; a second coupling member hinge-coupled to a lower portion of the sliding member to be spaced apart from the first coupling member; a third coupling member provided above a space between the first coupling member and the second coupling member; a fourth coupling member provided below a space between the first coupling member and the second coupling member; a link member having a quadrangular shape and hinge-coupled to each of the first coupling member, the second coupling member, the third coupling member, and the fourth coupling member; a screw shaft that is screw-coupled to the third coupling member and is rotatably coupled to the fourth coupling member; and a rotational motor coupled to the fourth coupling member to rotate the screw shaft, wherein when the screw shaft is rotated via the rotational motor in one direction to narrow a gap between the third coupling member and the fourth coupling member, a gap between the first coupling member and the second coupling member is widened via the link member, and when the screw shaft is rotated via the rotational motor in the other direction to widen a gap between the third coupling member and the fourth coupling member, a gap between the first coupling member and the second coupling member is narrowed via the link member, and the rear portion of the main link is rotated about the hinge shaft to adjust an angle of the display mounted at the front portion of the main link.

Also, the ceiling-type display position adjusting device may further include a cover member having a cut-off portion allowing the main link to protrude and thus be rotatable, the cover member being mounted at a lower portion of the sliding member to surround the supports and the angle adjusting unit.

Also, the elevating member may include: a lead screw, an upper end of which is rotatably coupled inside the body; an elevating unit coupled to an upper end of the sliding member to move up and down in a vertical direction by rotation of the lead screw; and a main motor rotating the lead screw, wherein when the main motor is rotated, the lead screw is rotated, and as the elevating unit moves up and down along the lead screw, the sliding member slides in a vertical direction to move the display upwardly or downwardly with respect to the ceiling.

Also, the ceiling-type display position adjusting device may further include a protection tube having a hollow shape into which the lead screw is inserted, wherein one side of the protection tube is mounted on the elevating unit and the other side of the protection tube is mounted at the lower portion of the sliding member such that the protection tube is moved up and down along with the elevating unit to surround the lead screw protruding below the elevating unit.

Also, a plurality of sliding grooves may be vertically formed in the body, and a plurality of coupling holes may be formed in the sliding member along the sliding grooves, and the ceiling-type display position adjusting device may further include a sliding projection that is inserted into and coupled to each of the coupling holes to slide along the sliding grooves, wherein the sliding projection includes: a sliding portion protruding from the sliding member to slide along the sliding grooves and including an inclined surface that is inwardly titled from an external surface thereof at an edge of an outer circumference thereof; and a coupling portion protruding from the sliding portion to be coupled to the coupling holes and having a protrusion at an end of the coupling portion, wherein the protrusion is inserted into the coupling holes and caught on an outer circumference of the coupling holes.

Advantageous Effects of Disclosure

As described above, according to the ceiling-type display position adjusting device of the present disclosure, which employs a link structure, following effects are obtained.

Firstly, via the elevating member and the angle adjusting unit, when a display is not watched, the display is maintained above the ceiling, and when the display is watched, the display automatically descends from the ceiling to allow watching and the watching angle of the display is automatically adjusted.

Secondly, by configuring the angle adjusting unit consisting of a link, the screw shaft is rotated in one direction or the other via the rotational motor to adjust a gap between the first coupling member and the second coupling member to thereby rotate a position of the coupling protrusion, to which the first coupling member is hinge-coupled, about the hinge shaft and thus easily adjust a position of the display, and changes in a watching angle due to a weight of the display may be prevented when the rotational motor is stopped.

Thirdly, by configuring the cover member as described above, the rear of each of the angle adjusting unit, the supports, and the main link included therein are not exposed, thereby maintaining the aesthetic sense and minimizing penetration of foreign substances.

Fourthly, by configuring the elevating member to include the lead screw, the elevating unit, and the main motor, installation may be easily performed, and the display may be easily moved above or below the ceiling.

Fifthly, as the protection tube surrounds the lead screw protruding below the elevating unit, lubrication oil coated on the lead screw may be prevented from falling to the outside and piling of foreign substances may be prevented.

Sixthly, by configuring the sliding projection including the sliding portion and the coupling portion as described above, as a plurality of sliding projections are included, resistance due to friction occurring during sliding of the sliding member may be minimized, and when the sliding portion of the sliding projection is worn out by friction, the sliding portion may be easily replaced by using the coupling portion.

BEST MODE

Figure 1:
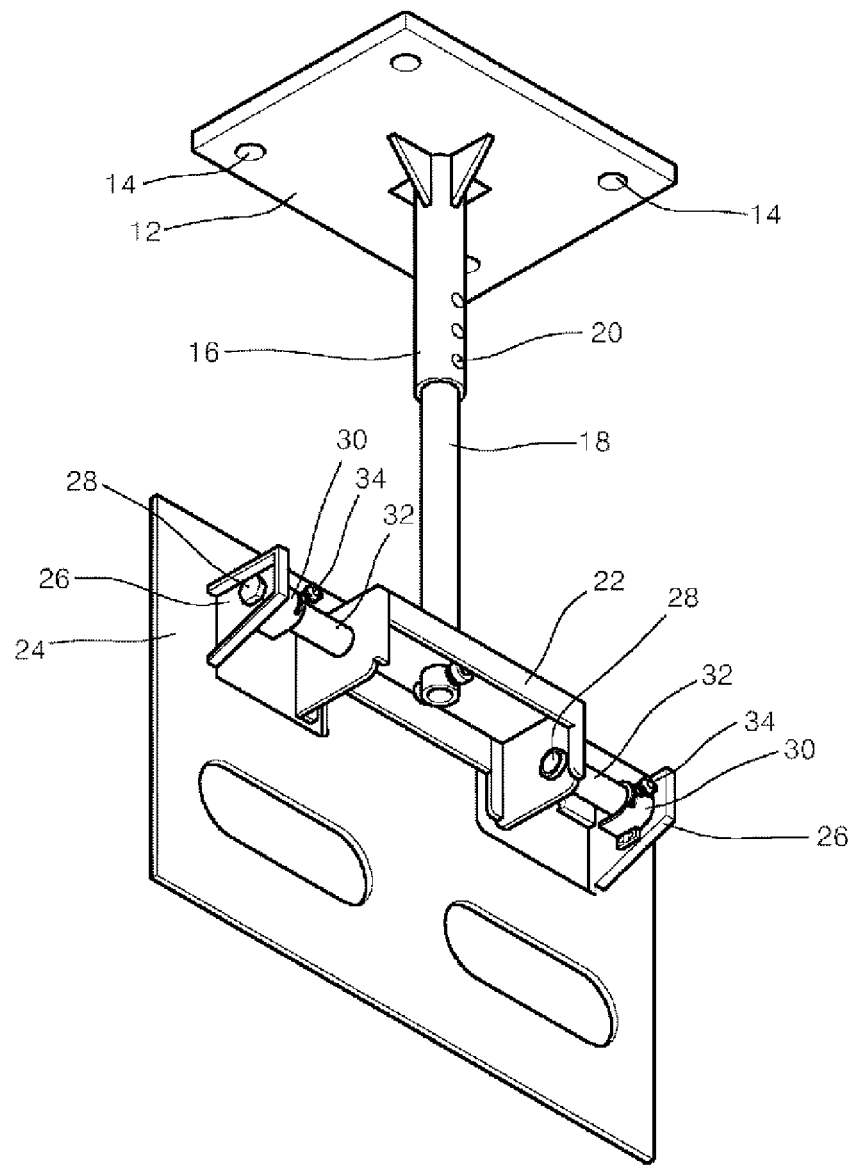
FIG. 1 is a structural diagram of a ceiling-hanging type display fixing device, according to the related art.
Figure 2:
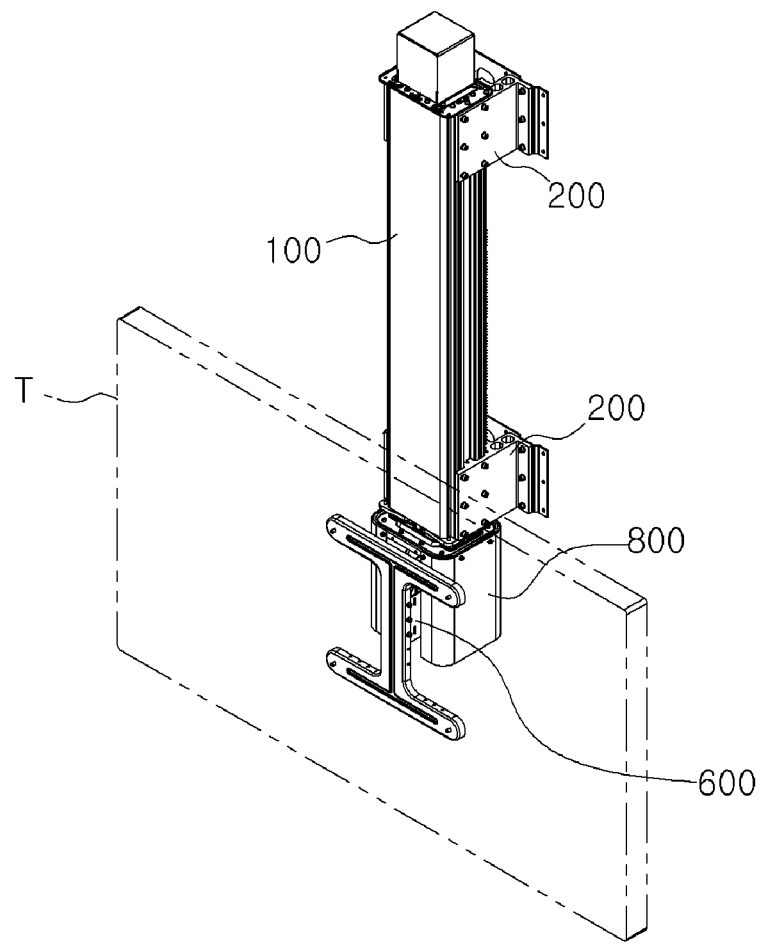
FIG. 2 is a perspective view of one side of a ceiling protruding-type display position adjusting device according to an embodiment of the present disclosure.

Provided is a ceiling-type display position adjusting device which employs a link structure and enables a display that is positioned above the ceiling when the display is not watched to automatically descend from the ceiling when the display is watched and automatically adjusts a watching angle of the display.

As illustrated in FIGS. 2 through 11, a protruding-type display T position adjusting device according to an embodiment of the present disclosure includes a body 100, a retaining bracket 200, a sliding member 300, an elevating member 400, supports 500, a main link 600, an angle adjusting unit 700, a cover member 800, and a sliding projection 900.

Figure 4:
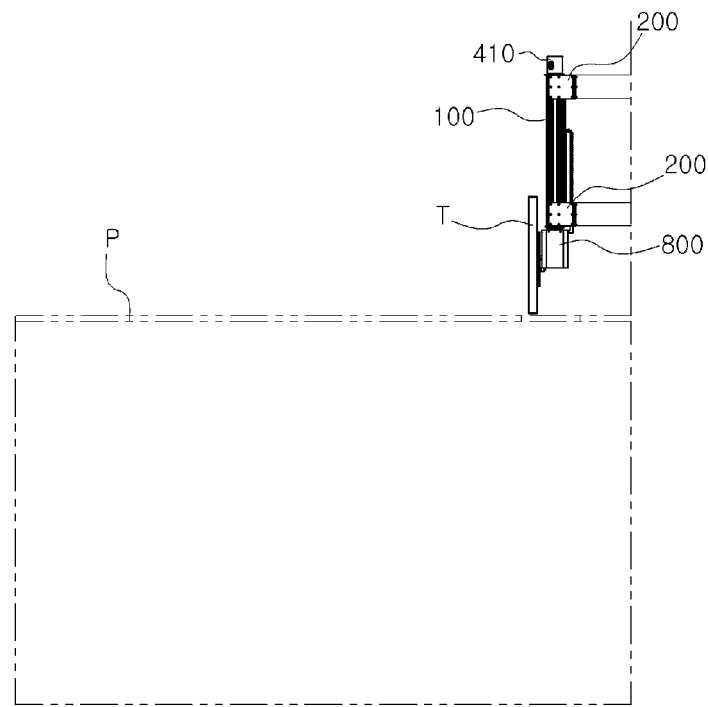
FIG. 4 is an exemplary view illustrating a display being moved by an elevating member of a ceiling protruding-type display position adjusting device according to an embodiment of the present disclosure.
Figure 4:
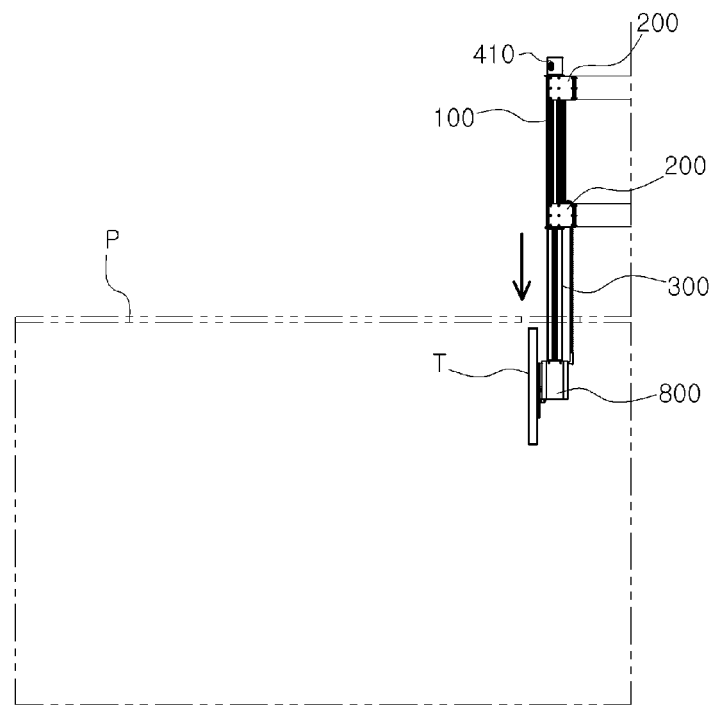
Figure 5:
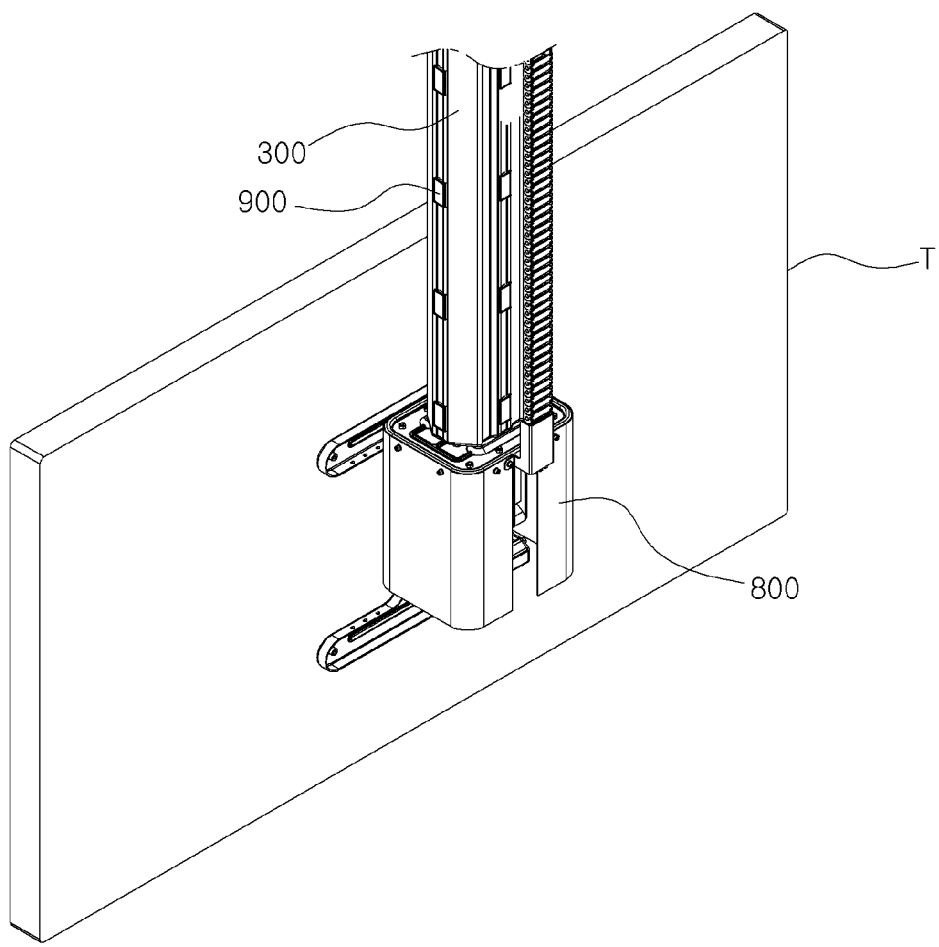
FIG. 5 is a perspective view of the other side of a sliding member slid from a body in a ceiling protruding-type display position adjusting device according to an embodiment of the present disclosure.

The body 100 has a hollow shape having an opened lower portion, and is disposed above the ceiling P as illustrated in FIG. 4.

That is, the body 100 is disposed on top of an indoor space, on the ceiling P.

Figure 3:
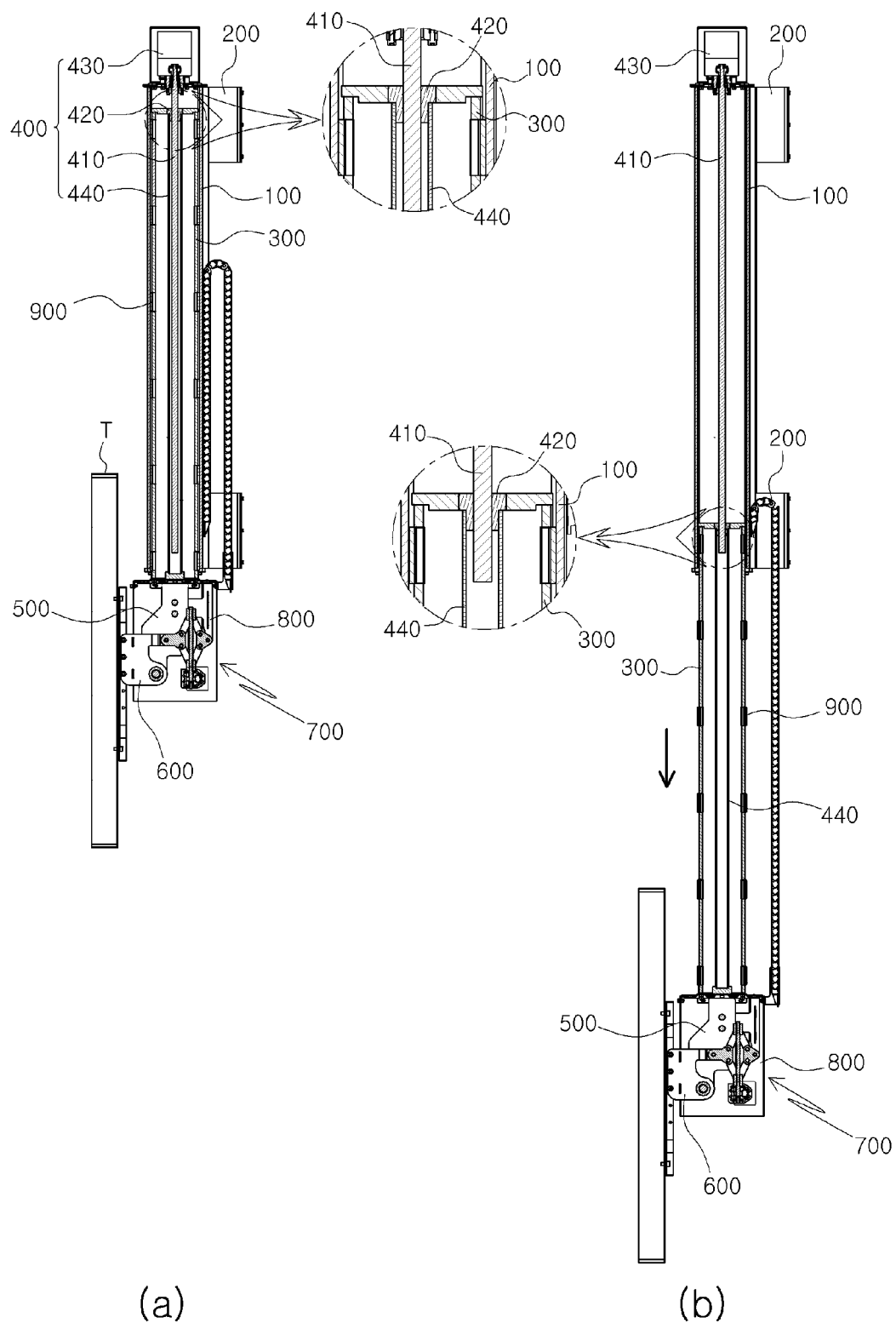
FIG. 3 is a side cross-sectional view illustrating a structure and operation of an elevating member of a ceiling protruding-type display position adjusting device according to an embodiment of the present disclosure.

Components which will be described later are mounted on the body 100 as illustrated in FIG. 3.

The retaining bracket 200 retains the body 100 as illustrated in FIG. 4.

That is, the retaining bracket 200 retains the body 100 on the ceiling P, thereby preventing the body 100 from moving or falling.

The sliding member 300 is mounted inside the body 100.

The sliding member 300 is slid in a vertical direction inside the body 100 by using the elevating member which will be described later and as illustrated in FIG. 3 to thereby elevate the display T above the ceiling P when the display T is not watched or lower the display T below the ceiling P when the display T is not watched.

Sliding of the sliding member 300 in the body 100 will be described in detail later.

The elevating member 400 slides the sliding member 300 in the body 100.

That is, the elevating member 400 moves the sliding member 300 into the body 100 or below the body 100 to locate the display T above or below the ceiling P.

The elevating member 400 includes a lead screw 410, an elevating unit 420, a main motor 430, and a protection tube 440.

An upper end of the lead screw 410 is rotatably coupled inside the body 100.

That is, the upper end of the lead screw 410 is rotatably coupled to an upper end of the body 100 such that the lead screw 410 is arranged inside the body 100 in a vertical direction as illustrated in FIG. 3 and inserted into the body 100 so as to be arranged in the sliding member 300 that is being slid.

The elevating unit 420 is coupled to an upper end of the sliding member 300 to move up and down in a vertical direction via rotation of the lead screw 410 as illustrated in FIG. 3.

In more detail, the elevating unit 420 is screw-coupled to the lead screw 410 to be coupled to the upper end of the sliding member 300 and moves up and down in a vertical direction along the lead screw 410.

The elevating unit 420 lifts up the sliding member 300 via rotation of the lead screw 410 as illustrated in FIG. 3(a) such that the display T is disposed above the ceiling P as illustrated in FIG. 4(a) or lowers the sliding member 300 as illustrated in FIG. 3(b) such that the display T is disposed below the ceiling P as illustrated in FIG. 4(b).

The main motor 430 rotates the lead screw 410.

That is, as illustrated in FIG. 3, the main motor 430 is coupled to the upper end of the lead screw 410 that is rotatably coupled to an upper portion of the body 100, thereby rotating the lead screw 410 and thus allowing the elevating member 400 to move up and down in a vertical direction.

In the elevating member 400, the lead screw 410 is rotated via rotation of the main motor 430 and the elevating unit 420 moves up and down along the lead screw 410, and accordingly, the sliding member 300 is slid in a vertical direction to move the display T upwardly or downwardly with respect to the ceiling P.

By configuring the elevating member 400 to include the lead screw 410, the elevating unit 420, and the main motor 430, installation may be easily performed, and the display T may be easily moved above or below the ceiling P.

In the present embodiment, the elevating member 400 includes the lead screw 410, the elevating unit 420, and the main motor 430. However, unlike the present embodiment, the elevating member 400 may also include other components as long as the elevating member 400 is capable of sliding the sliding member 300.

Meanwhile, the protection tube 440 has a hollow shape into which the lead screw 410 is inserted, as illustrated in FIG. 3; one side of the protection tube 440 is mounted on the elevating unit 420, and the other side thereof is mounted at a lower portion of the sliding member 300.

The protection tube 440 is moved up and down along with the sliding member 300 and the elevating unit 420 to surround the lead screw 410 protruding below the elevating unit 420.

As the protection tube 440 surrounds the lead screw 410 protruding below the elevating unit 420, lubrication oil coated on the lead screw 410 may be prevented from falling to the outside and piling of foreign substances may be prevented.

Figure 6:
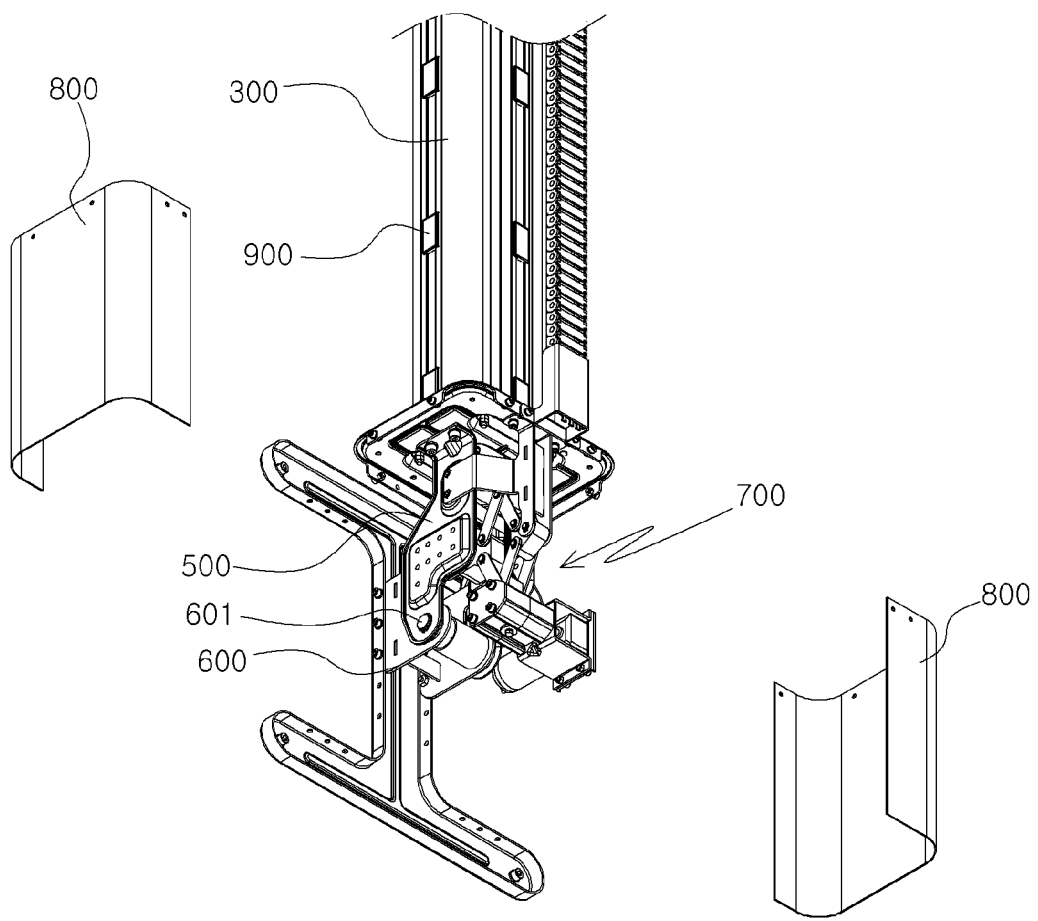
FIG. 6 is a bottom perspective view showing an angle adjusting unit of a ceiling protruding-type display position adjusting device according to an embodiment of the present disclosure.
Figure 7:
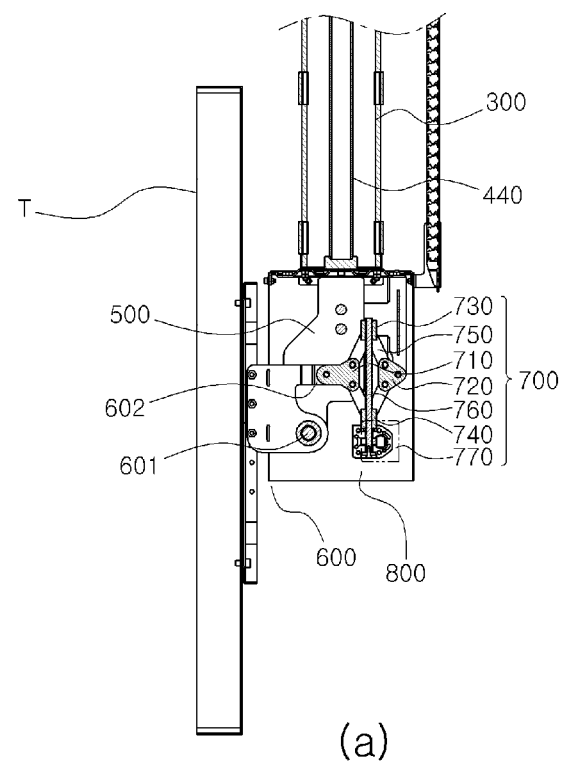
FIG. 7 is a side cross-sectional view illustrating a structure and operation of an angle adjusting unit of a ceiling protruding-type display position adjusting device according to an embodiment of the present disclosure.
Figure 7:
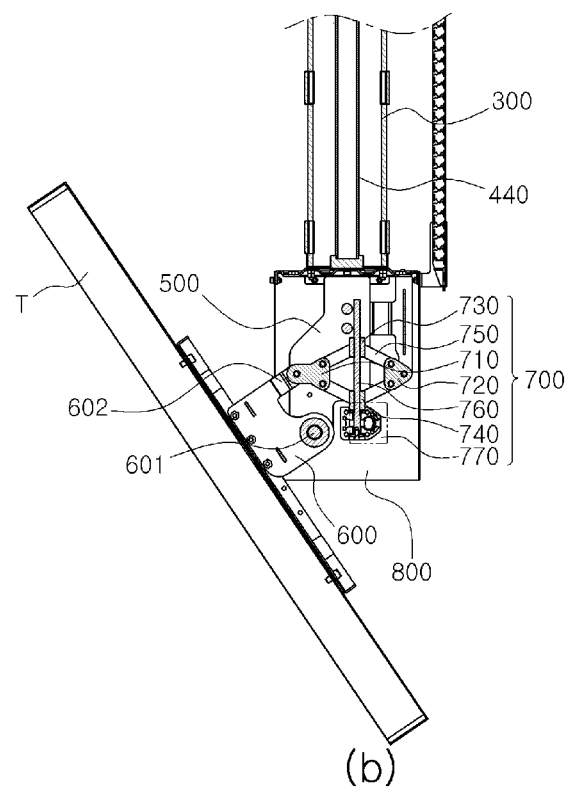

The supports 500 are coupled under the sliding member 300 on both, left and right sides as illustrated in FIGS. 3, 6, and 7.

The supports 500, to which the angle adjusting unit 700 and the main link 600 which will be described later are coupled as illustrated in FIG. 3, rotate the main link 600 to support a watching angle of the display T coupled to the main link 600.

A rear portion of the main link 600 is rotatably coupled between the supports 500 via a hinge shaft 601, and the display T is mounted at a front portion thereof.

That is, as the rear portion of the main link 600 is rotatably coupled between the supports 500 via the hinge shaft 601 as illustrated in FIGS. 6 and 7, the front portion of the main link 600 is rotated about the hinge shaft 601 in a vertical direction to adjust a watching angle of the display T mounted at the front portion thereof.

A coupling protrusion 602 that is hinge-coupled to the angle adjusting unit 700 which will be described later protrudes from the rear portion of the main link 600 such that the main link 600 is rotated about the hinge shaft 601.

That is, the coupling protrusion 602 protrudes apart from the hinge shaft 601 such that the main link 600 is rotatable about the hinge shaft 601 via the angle adjusting unit 700.

The angle adjusting unit 700 rotates the main link 600 about the hinge shaft 601 to adjust an angle of the display T mounted at the front portion of the main link 600.

That is, the angle adjusting unit 700 rotates the main link 600 moved below the ceiling P via the elevating member 400 to adjust a watching angle of the display T as illustrated in FIG. 8(b).

The angle adjusting unit 700 includes a first coupling member 710, a second coupling member 720, a third coupling member 730, a fourth coupling member 740, a link member 750, a screw shaft 760, and a rotational motor 770.

The first coupling member 710 is hinge-coupled to the coupling protrusion 602 as illustrated in FIGS. 6 and 7.

Also, the second coupling member 720 is hinge-coupled to a lower portion of the sliding member 300 to be spaced apart from the first coupling member 710.

The first coupling member 710 and the second coupling member 720 are varied in an opposite manner to each other via the link member 750 according to a variation in a gap between the third coupling member 730 and the fourth coupling member 740.

That is, a gap between the first coupling member 710 and the second coupling member 720 is widened when a gap between the third coupling member 730 and the fourth coupling member 740 is narrowed via the link member 750, and vice versa.

The second coupling member 720 is hinge-coupled to the sliding member 300, and thus, a position of the second coupling member 720 is not varied, and as a position of the first coupling member 710 is varied, a position of the coupling protrusion 602 hinge-coupled to the first coupling member 710 is moved to rotate the main link 600 about the hinge shaft 601, thereby adjusting a position of the display T.

The third coupling member 730 is provided above a space between the first coupling member 710 and the second coupling member 720.

The third coupling member 730 is screw-coupled to the screw shaft 760 which will be described later, and is moved in a vertical direction according to rotation of the screw shaft 760.

In addition, the fourth coupling member 740 is provided below a space between the first coupling member 710 and the second coupling member 720 to be spaced apart from the third coupling member 730.

The screw shaft 760, which will be described later, is rotatably coupled to the fourth coupling member 740, and the rotational motor 770 is coupled and fixed to the fourth coupling member 740.

The link member 750 has a quadrangular shape and is hinge-coupled to each of the first coupling member 710, the second coupling member 720, the third coupling member 730, and the fourth coupling member 740.

That is, the link member 750 is arranged at a vertex of each of the first coupling member 710, the second coupling member 720, the third coupling member 730, and the fourth coupling member 740 and hinge-coupled thereto to form a quadrangle shape.

The link member 750 coupled as described above allows a gap between the third coupling member 730 and the fourth coupling member 740 to be varied in an opposite manner to a variation in a gap between the first coupling member 710 and the second coupling member 720.

In detail, the link member 750 allows a gap between the first coupling member 710 and the second coupling member 720 to widen when a gap between the third coupling member 730 and the fourth coupling member 740 is narrowed, and allows a gap between the first coupling member 710 and the second coupling member 720 to narrow when a gap between the third coupling member 730 and the fourth coupling member 740 is widened.

The screw shaft 760 is screw-coupled to the third coupling member 730 and is rotatably coupled to the fourth coupling member 740 as described above.

As the screw shaft 760 coupled as described above is rotated, the third coupling member 730 that is screw-coupled thereto is moved along the screw shaft 760, thereby adjusting a gap between the third coupling member 730 and the fourth coupling member 740.

Also, the rotational motor 770 is coupled to the fourth coupling member 740 to rotate the screw shaft 760.

The rotational motor 770 rotates the screw shaft 760 in one direction as illustrated in 7(a) to widen a gap between the first coupling member 710 and the second coupling member 720 via the link member 750 when a gap between the third coupling member 730 and the fourth coupling member 740 is narrowed; the rotational motor 770 rotates the screw shaft 760 in the other direction as illustrated in FIG. 7(b) to narrow a gap between the first coupling member 710 and the second coupling member 720 via the link member 750 when a gap between the third coupling member 730 and the fourth coupling member 740 is widened.

By configuring the angle adjusting unit 700 consisting of a link as described above, the screw shaft 760 is rotated in one direction or the other via the rotational motor 770 to adjust a gap between the first coupling member 710 and the second coupling member 720 to thereby rotate a position of the coupling protrusion 602, to which the first coupling member 710 is hinge-coupled, about the hinge shaft 601 and thus easily adjust a position of the display T, and changes in a watching angle due to a weight of the display T may be prevented when the rotational motor 770 is stopped.

The cover member 800 is mounted at the lower portion of the sliding member 300 to surround the supports 500 and the angle adjusting unit 700 as illustrated in FIGS. 2, 5, 6, and 9.

A cut-off portion 801 is formed in the cover member 800 such that a front end of the main link 600 is protruded to be rotatable, that is, a front portion of the main link 600 is vertically movable.

By configuring the cover member 800 as described above, the rear of each of the angle adjusting unit 700, the supports 500, and the main link 600 included therein are not exposed, thereby maintaining the aesthetic sense and minimizing penetration of foreign substances.

Figure 10:
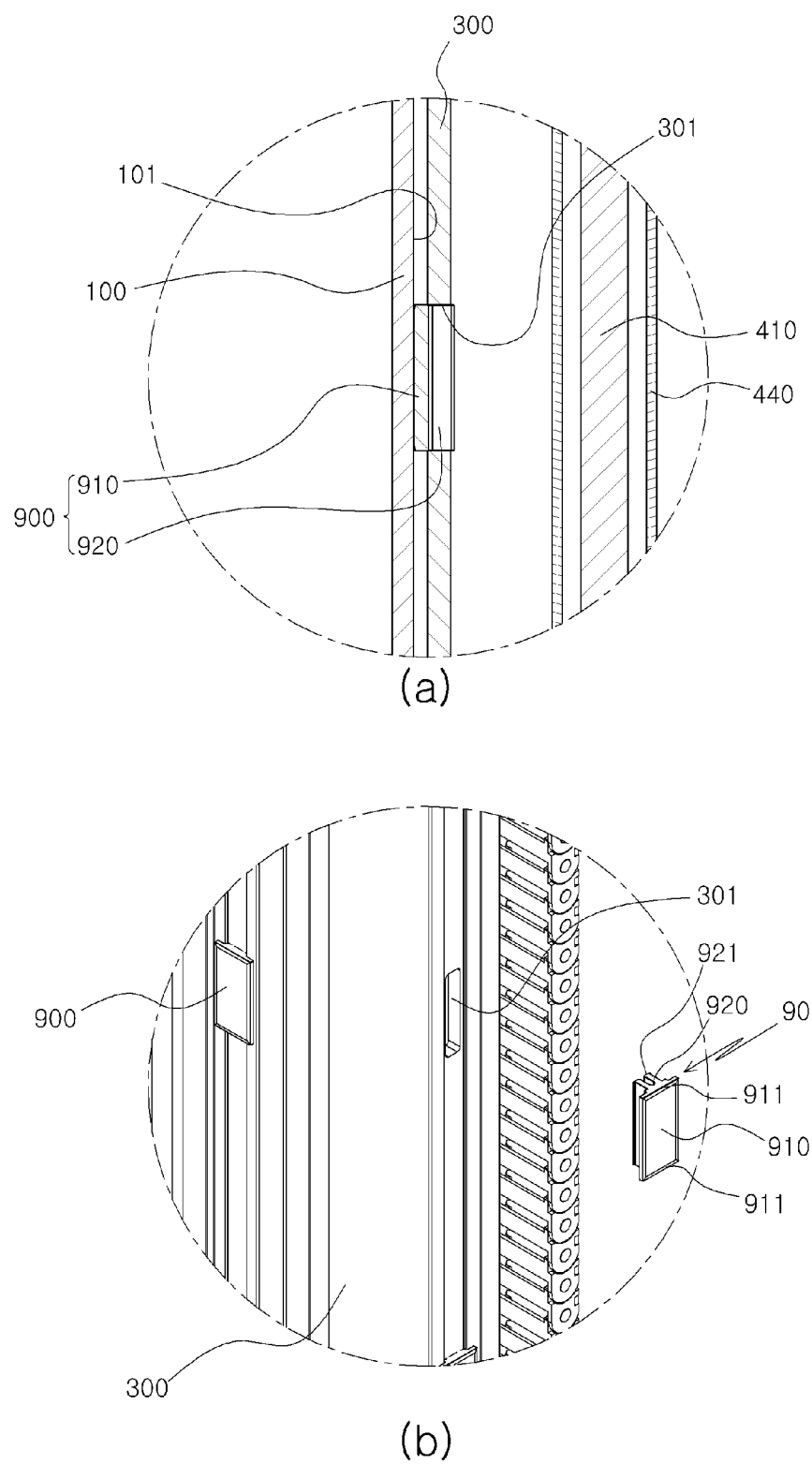
FIG. 10 is a side cross-sectional view and a disassembled perspective view of a sliding projection in a ceiling protruding-type display position adjusting device according to an embodiment of the present disclosure.
Figure 11:
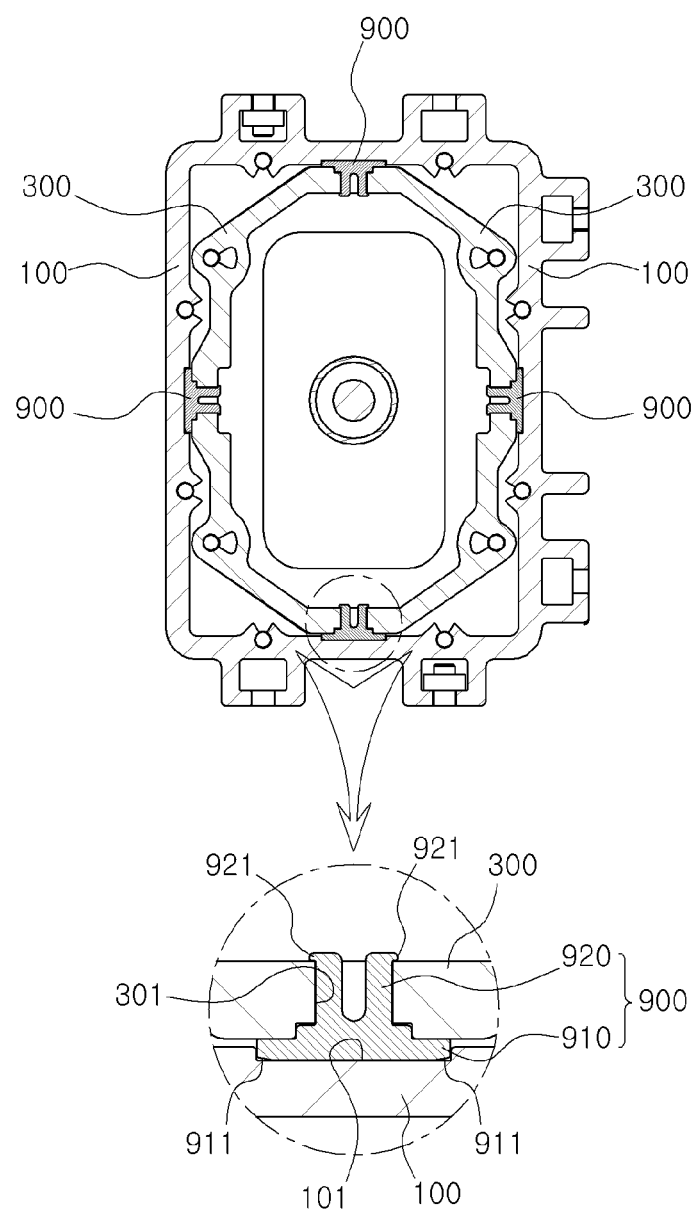
FIG. 11 is a planar cross-sectional view of a sliding projection in a ceiling protruding-type display position adjusting device according to an embodiment of the present disclosure.

Meanwhile, as illustrated in FIGS. 10(a) and 11, a plurality of sliding grooves 101 are vertically formed in the body 100, and a plurality of coupling holes 301 are formed in the sliding member 300 along the sliding grooves 101.

Also, the sliding projection 900 is inserted into and coupled to the coupling hole 301 to slide along the sliding grooves 101.

That is, a plurality of sliding projections 900 are coupled to the coupling holes 301 and slide along the sliding grooves 101 formed in the body 100 to facilitate sliding of the sliding member 300 in the body 100 described above.

The sliding projection 900 includes a sliding portion 910 and a coupling portion 920 as illustrated in FIGS. 10 and 11.

The sliding portion 910 protrudes from the sliding member 300 to slide along the sliding grooves 101 as illustrated in FIGS. 10(a) and 11.

An inclined surface 911 that is inwardly titled from an external surface thereof is formed at an edge of an outer circumference of the sliding portion 910 as illustrated in FIGS. 10 and 11.

When the sliding member 300 including the plurality of sliding projections 900 is lifted after being slid and lowered from the body 100, the inclined surface 911 is used to facilitate sliding of the sliding portion 910 by allowing the sliding portion 910 to be inserted without being caught by the sliding grooves 101.

Also, the coupling portion 920 protrudes from the sliding portion 910 to be coupled to the coupling hole 301 as illustrated in FIGS. 10 and 11.

A protrusion 921 that is inserted into the coupling hole 301 and caught on an edge of an outer circumference of an inner side of the coupling hole 301 is formed at an end of the coupling portion 920 as illustrated in FIGS. 10(b) and 11.

The protrusion 921 ensures coupling of the sliding projection 900 coupled to the coupling hole 301 to prevent the sliding projection 900 from detaching.

By configuring the sliding projection 900 including the sliding portion 910 and the coupling portion 920 as described above, as a plurality of sliding projections 900 are included, resistance due to friction occurring during sliding of the sliding member 300 may be minimized, and when the sliding portion 910 of the sliding projection 900 is worn out by friction, the sliding portion 910 may be easily replaced by using the coupling portion 920.

A process of operating the ceiling protruding-type display position adjusting device according to an embodiment of the present disclosure configured as described above will now be described.

First, the body 100 over which the sliding member 300 is slid to be placed thereon is mounted such that the display T is placed above the ceiling P as illustrated in FIG. 4(a).

When watching the display T, as the main motor 430 is rotated as illustrated in FIG. 3, the elevating unit 420 is lowered along with the lead screw 410 to lower the sliding member 300 so that the display T arranged below the sliding member 300 is lowered down below the ceiling P to come into sight as illustrated in FIG. 4(*b*).

Figure 8:
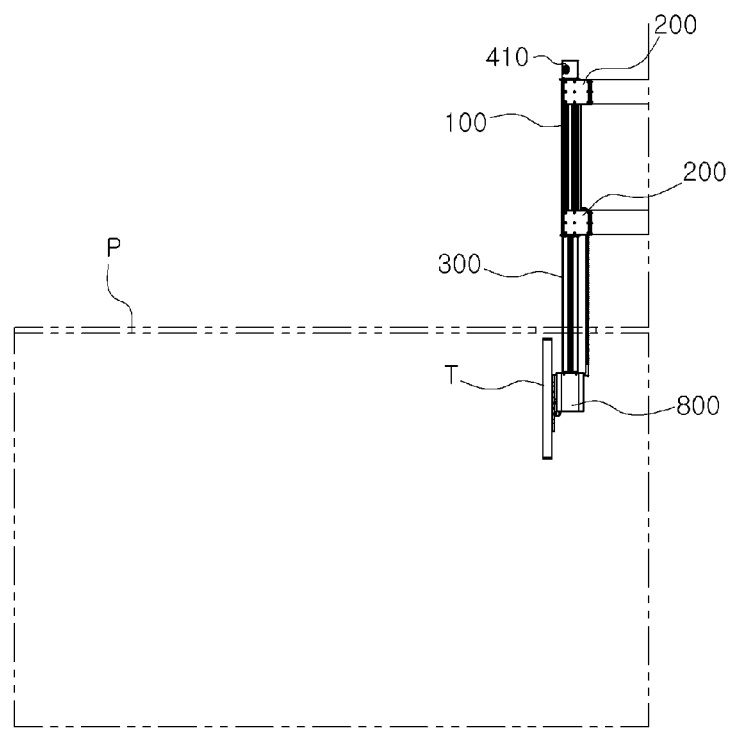
FIG. 8 is an exemplary view illustrating a display being moved by an angle adjusting unit of a ceiling protruding-type display position adjusting device according to an embodiment of the present disclosure.
Figure 8:
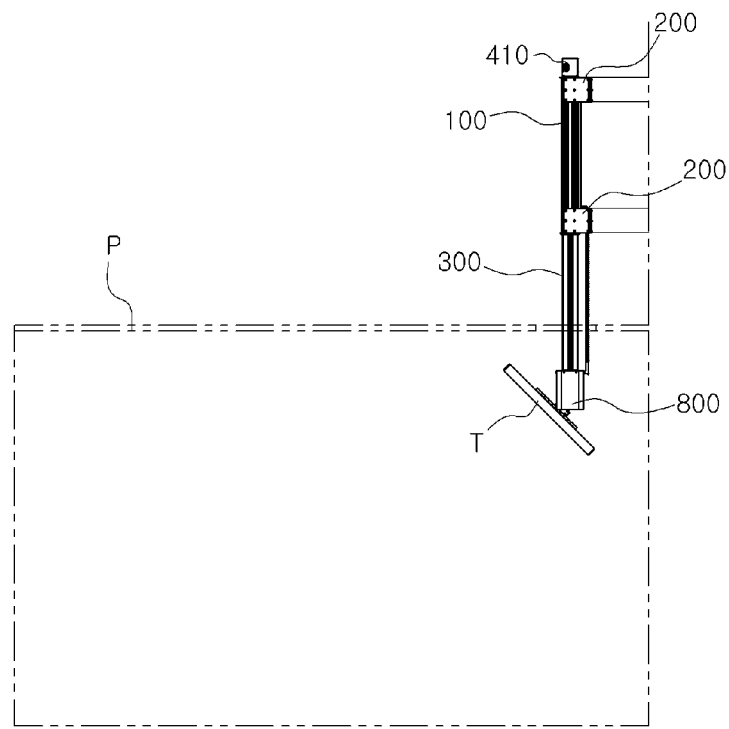
Figure 9:
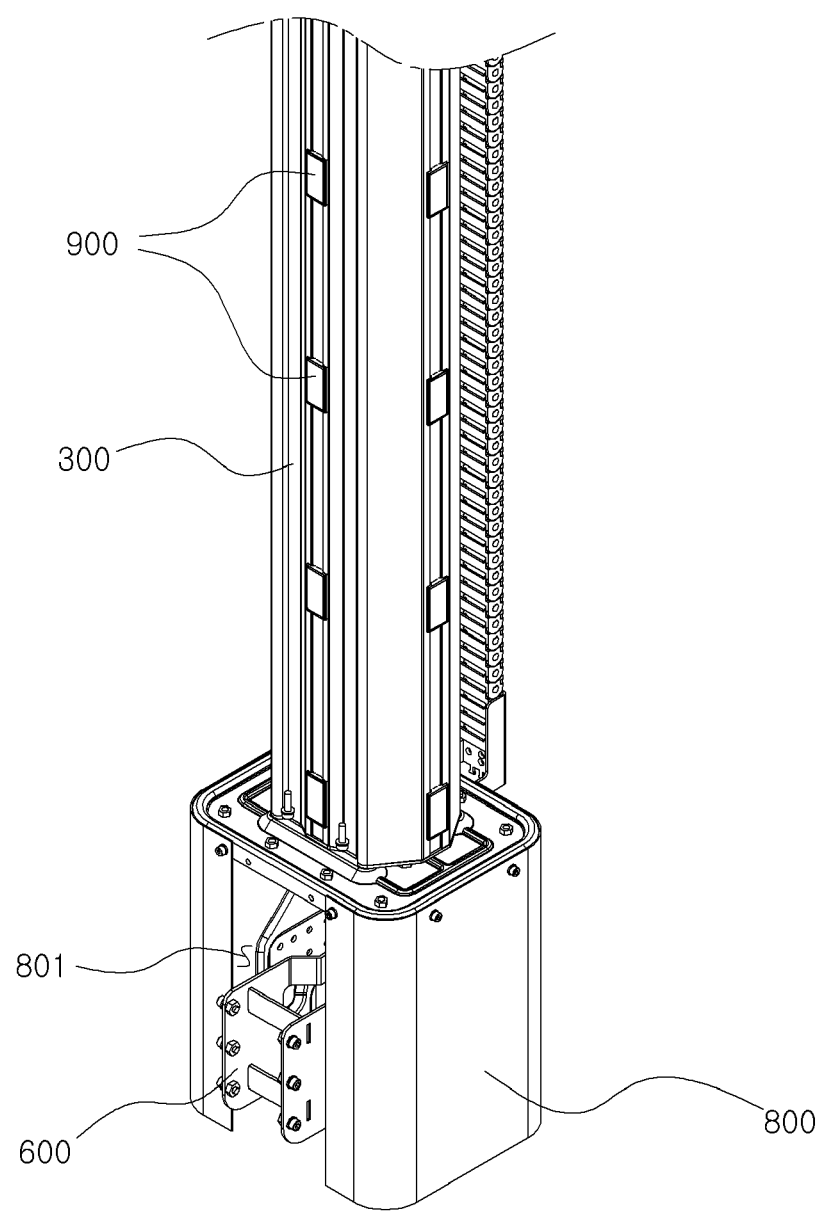
FIG. 9 is a perspective view illustrating a structure of a cover member in a ceiling protruding-type display position adjusting device according to an embodiment of the present disclosure.

When the display T is lowered below the ceiling P as above, as illustrated in FIG. 7, the main link 600 is rotated using the angle adjusting unit 700 to adjust an angle of the display T as illustrated in FIG. 8(*b*) to make it easy to watch the display T.

When the watching is ended, on the other hand, the reverse process is performed and the display T is placed above the ceiling P and is not in sight in an indoor space.

As described above, via the elevating member 400 and the angle adjusting unit 700, when the display T is not watched, the display T is maintained above the ceiling P, and when the display T is watched, the display T may automatically descend from the ceiling P to allow watching and the watching angle of the display T may be automatically adjusted.

The ceiling protruding-type display position adjusting device according to the present disclosure is not limited to the above-described embodiment, and may be modified in various manners within the scope of the present disclosure.

INDUSTRIAL APPLICABILITY

The ceiling-type display position adjusting device according to the present disclosure, including a link structure, locates the display above the ceiling when the display is not watched and lowers the display below the ceiling when the display is watched and even automatically adjusts a watching angle.

The invention claimed is:

1. A ceiling-type display position adjusting device employing a link structure and comprising:
   a body having a hollow shape having an opened lower portion and arranged above a ceiling;
   a retaining bracket retaining the body;
   a sliding member that is mounted inside the body and slidable downward below the ceiling;
   an elevating member sliding the sliding member downward below the body;
   supports coupled under the sliding member on left and right sides;
   a main link having a rear portion rotatably coupled between the supports via a hinge shaft and a front portion at which a display is mounted; and
   an angle adjusting unit rotating the main link about the hinge shaft to adjust an angle of the display,
   wherein the elevating member slides the sliding member in the body in a vertical direction to move the display above or below the ceiling, and the angle adjusting unit rotates the main link that is moved below the ceiling via the elevating member to adjust a watching angle of the display,
   wherein a coupling protrusion that is hinge-coupled to the angle adjusting unit protrudes from the rear portion of the main link to rotate the main link about the hinge shaft,
   wherein the angle adjusting unit comprises:
      a first coupling member hinge-coupled to the coupling protrusion;
      a second coupling member hinge-coupled to a lower portion of the sliding member to be spaced apart from the first coupling member;
      a third coupling member provided above a space between the first coupling member and the second coupling member;
      a fourth coupling member provided below a space between the first coupling member and the second coupling member;
      a link member having a quadrangular shape and hinge-coupled to each of the first coupling member, the second coupling member, the third coupling member, and the fourth coupling member;
      a screw shaft that is screw-coupled to the third coupling member and is rotatably coupled to the fourth coupling member; and
      a rotational motor coupled to the fourth coupling member to rotate the screw shaft,
   wherein when the screw shaft is rotated via the rotational motor in one direction to narrow a gap between the third coupling member and the fourth coupling member, a gap between the first coupling member and the second coupling member is widened via the link member, and
   when the screw shaft is rotated via the rotational motor in the other direction to widen a gap between the third coupling member and the fourth coupling member, a gap between the first coupling member and the second coupling member is narrowed via the link member, and the rear portion of the main link is rotated about the hinge shaft to adjust an angle of the display mounted at the front portion of the main link,
   wherein a plurality of sliding grooves are vertically formed in the body, and
   a plurality of coupling holes are formed in the sliding member along the sliding grooves, and
   the ceiling-type display position adjusting device further comprises a sliding projection that is inserted into and coupled to each of the coupling holes to slide along the sliding grooves,
   wherein the sliding projection comprises:
      a sliding portion protruding from the sliding member to slide along the sliding grooves and comprising an inclined surface that is inwardly titled from an external surface thereof at an edge of an outer circumference thereof; and
      a coupling portion protruding from the sliding portion to be coupled to the coupling holes and having a protrusion at an end of the coupling portion,
   wherein the protrusion is inserted into the coupling holes and caught on an edge of an outer circumference of an inner side of the coupling holes.

2. The ceiling-type display position adjusting device of claim 1, further comprising a cover member having a cut-off portion allowing a front end of the main link to protrude and thus the main link to be rotatable, the cover member being mounted at a lower portion of the sliding member to surround the supports and the angle adjusting unit.

3. The ceiling-type display position adjusting device of claim 1, wherein the elevating member comprises:
   a lead screw, an upper end of which is rotatably coupled inside the body;
   an elevating unit coupled to an upper end of the sliding member to move up and down in a vertical direction by rotation of the lead screw; and
   a main motor rotating the lead screw,
   wherein when the main motor is rotated, the lead screw is rotated, and as the elevating unit moves up and down along the lead screw, the sliding member slides in a vertical direction to move the display upwardly or downwardly with respect to the ceiling.

4. The ceiling-type display position adjusting device of claim 3, further comprising a protection tube having a hollow shape into which the lead screw is inserted, wherein one side of the protection tube is mounted on the elevating unit and the other side of the protection tube is mounted at the lower portion of the sliding member such that the protection tube is moved up and down along with the elevating unit to surround the lead screw protruding below the elevating unit.

* * * * *